United States Patent [19]
Malhi et al.

[11] Patent Number: 5,382,536
[45] Date of Patent: Jan. 17, 1995

[54] METHOD OF FABRICATING LATERAL DMOS STRUCTURE

[75] Inventors: Satwinder Malhi, Garland; Michael C. Smayling, Missouri City; Stephen A. Keller, Sugarland, all of Tex.

[73] Assignee: Texas Instruments Incorporated, Dallas, Tex.

[21] Appl. No.: 31,731

[22] Filed: Mar. 15, 1993

[51] Int. Cl.6 .......................................... H01L 21/265
[52] U.S. Cl. .................................. 437/41; 437/44; 437/150; 437/154; 437/45; 148/DIG. 126
[58] Field of Search ................. 437/40, 41, 43, 44, 437/45, 29, 59, 69, 909, 150–154; 148/DIG. 126, 96; 257/328, 336, 401, 141

[56] References Cited

U.S. PATENT DOCUMENTS

| | | | |
|---|---|---|---|
| 4,890,142 | 12/1989 | Tonnel et al. | 357/23.4 |
| 4,902,636 | 2/1990 | Akiyama et al. | 437/45 |
| 4,904,614 | 2/1990 | Fisher et al. | 437/41 |
| 4,922,327 | 5/1990 | Mena et al. | 357/23.4 |
| 5,059,547 | 10/1991 | Shirai | 437/40 |
| 5,068,700 | 11/1991 | Yamaguchi et al. | 357/23.8 |
| 5,225,700 | 7/1993 | Smayling | 257/321 |
| 5,237,193 | 8/1993 | Williams et al. | 257/336 |
| 5,242,841 | 9/1993 | Smayling et al. | 437/29 |
| 5,248,627 | 9/1993 | Williams | 437/45 |

Primary Examiner—George Fourson
Assistant Examiner—David M. Mason
Attorney, Agent, or Firm—Ira S. Matsil; James C. Kesterson; Richard L. Donaldson

[57] ABSTRACT

A lateral DMOS (LDMOS) transistor 10 is disclosed herein. In one embodiment, an n doped silicon layer 14 is provided and a field oxide region 24 is formed therein. A p doped D-well region 20 is formed in the silicon layer 14 and includes a p doped shallow, extension region 22 which extends from the D-well region 20 to a first side of the field oxide region 24. A first n doped source/drain region 16 is formed in the D-well region 20 and is spaced from the field oxide region 24. Also, a second n doped source/drain region 18 formed in the silicon layer 14 on a second side of the field oxide region 24. A gate region 26 is formed over the surface of the silicon layer 14 and over a portion of the first source/drain region 16, the D-well region 20, and a portion of the field oxide region 24.

22 Claims, 4 Drawing Sheets

METHOD OF FABRICATING LATERAL DMOS STRUCTURE

SUMMARY OF THE INVENTION

This invention generally relates to the fabrication of semiconductor devices and specifically to a DMOS structure with a lightly doped surface and method for forming the same.

BACKGROUND OF THE INVENTION

Future intelligent power ICs will require high-density power devices along with analog functions and VLSI logic. A conventional structure Lateral DMOS (LDMOS) device is well suited for incorporation into VLSI processes because of its simplicity. However, LDMOS devices have been considered inferior to Vertical DMOS (VDMOS) devices, and therefore have not received significant attention. Recently, a RESURF (REduced SURface Field) LDMOS device with good specific on-resistance ($R_{sp}$) has been demonstrated. But that device structure is more complex and not very versatile, being limited to grounded source applications.

Accordingly, improvements which overcome any or all of the problems are presently desirable.

SUMMARY OF THE INVENTION

Other objects and advantages will be obvious, and will in part appear hereinafter and will be accomplished by the present invention which provides a method and structure for a DMOS structure with a lightly doped surface.

A lateral DMOS (LDMOS) transistor is disclosed herein. In one embodiment, an n doped silicon layer is provided and a field oxide region is formed therein. A p doped D-well region is formed in the silicon layer and includes a p doped shallow, extension region which extends from the D-well region to a first side of the field oxide region. A first n doped source/drain region is formed in the D-well region and is spaced from the field oxide region. Also, a second n doped source/drain region formed in the silicon layer on a second side of the field oxide region opposite the first side. A gate region is formed over the surface of the silicon layer and over a portion of the first source/drain region, the p well region, and a portion of the field oxide region.

The LDMOS structure is simpler and more versatile than other structures. It can also be isolated to allow several devices to be integrated on the same chip for low-side, high-side, and H-bridge driver applications.

The device can be optimized to work in high power applications such as for 60V operation. These 60V devices are excellent power components for VLSI intelligent power applications.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the structure and fabrication method of the present invention. The preferred embodiment structure will be described first along with a description of modifications. A preferred method of foxing the structure will then be described.

For intelligent power IC applications that require a large amount of logic and memory along with power capability, DMOS devices compatible with VLSI processes are required. A classical DMOS device has a D-well self-aligned to a poly gate. However, when fabrication of the DMOS device is inserted in a VLSI logic process, the high temperature D-well diffusion must precede the $V_T$ adjust implants of the logic devices. Accordingly, the poly gate will not be self aligned to the D-well. This patent describes a method of improving the parametric control of the resulting LDMOS device by including a novel, lightly doped, implant extension to D-well edge, self-aligned to the field insulator.

Figure 1:
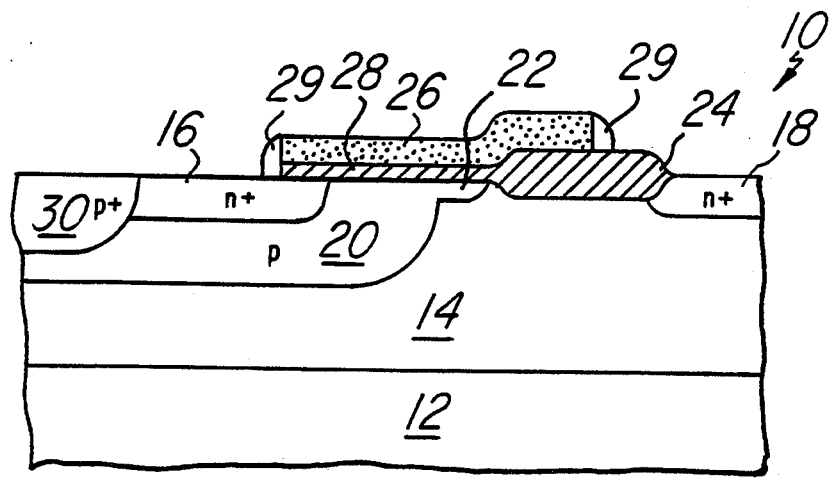
FIG. 1 is cross-sectional view of a preferred embodiment LDMOS transistor device.

Referring first to FIG. 1, a preferred embodiment structure 10 is illustrated. The transistor device is formed on a semiconductor substrate 12 which preferably comprises single crystalline silicon. However, polycrystalline layers 12 can also be used as well as other semiconductor materials. A semiconductor layer 14 is illustrated overlying substrate 12. The semiconductor layer 14 may comprise an epitaxially grown layer 14 formed over substrate 12 or a well (or tub) region 14 formed in substrate 12 (or combinations of both). Alternatively, the layer 14 can be omitted and the transistor device formed directly in the substrate 12. Typically, but not necessarily, the layers 12 and 14 comprise opposite conductivity types. For example, the substrate 12 may be a p-doped substrate and the layer 14 an n-doped layer.

The field effect transistor of the present invention comprises a source region 16 and a drain region 18. To simplify the discussion, only an n-channel transistor will be specifically discussed. However, it should be understood that the inventive concepts would apply to both n and p channel devices.

The n doped source region 16 is formed in a p doped well region 20. The well region 20 is often referred to as a D-well. Adjacent the p doped D-well region 20 is a shallow extension region 22, also doped with p type impurities. The shallow extension region 22 extends from the D-well region 20 to a first end of field insulating region 24. The drain region 18 is adjacent to the other end of the field insulating region 24. In the preferred embodiment, the field insulating region 24 comprises a field oxide such as thermally grown silicon dioxide, for example.

With device structures formed without including the extension region 22, it has been observed that the distance between the edge of D-well 20 and the field insulating region 24 is an important variable which has a potentially large impact on device parametric control.

The lightly doped region 22 described herein forms an extension to the D-well 20 which aligns it to the field oxide 24 edge. By properly adjusting the dose and energy of the D-well surface extension 22 implant, high breakdown voltage may be maintained without increasing drift resistance due to localized current crowding. In this manner, device parametric control can potentially be significantly improved. In experimental devices fabricated, it has been observed that the operation of the device does not degrade with the inclusion of the lightly doped region 22.

A gate electrode 26 is formed over the surface of layer 14. In the illustrated embodiment, the gate 26 extends from over a portion of source 16 to over a portion of the field insulating region 24. In the preferred embodiment, the gate electrode comprises doped silicon (usually polycrystalline but possibly amorphous or even monocrystalline). Other conductive materials including metals or silicides can also be used.

The gate 26 is separated from the surface of layer 14 by a gate dielectric 28, the gate dielectric 28 may comprise either an oxide or a nitride or a combination of both (e.g., a stacked NO or ONO layer).

Sidewall insulating regions 29 may be formed on the sidewalls of gate electrode 26. The sidewall regions typically comprise an oxide material such as silicon dioxide or a nitride material such as silicon nitride.

Figure 6:
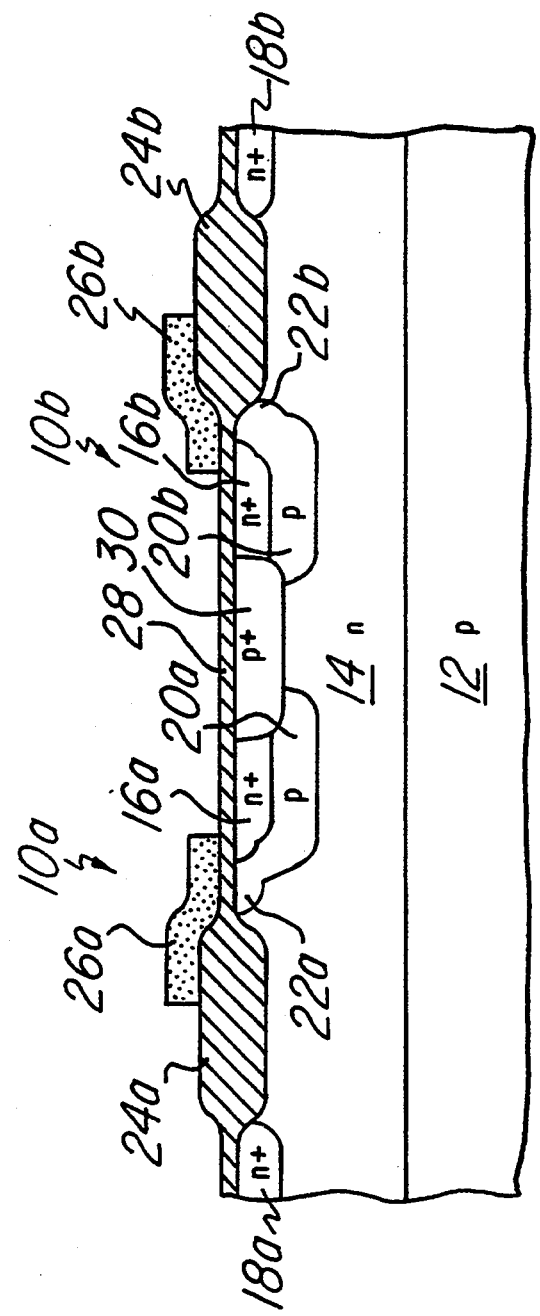

A more heavily doped body region SO is also illustrated in FIG. 1. The body region 30 may be included to allow good contact to D-well region 20. An example of this is shown in FIG. 6. The body region 30 is typically more heavily doped than the D-well region 20.

A preferred method for fabricating a transistor device 10 will now be described with reference to FIGS. 2 through 6.

Figure 2:
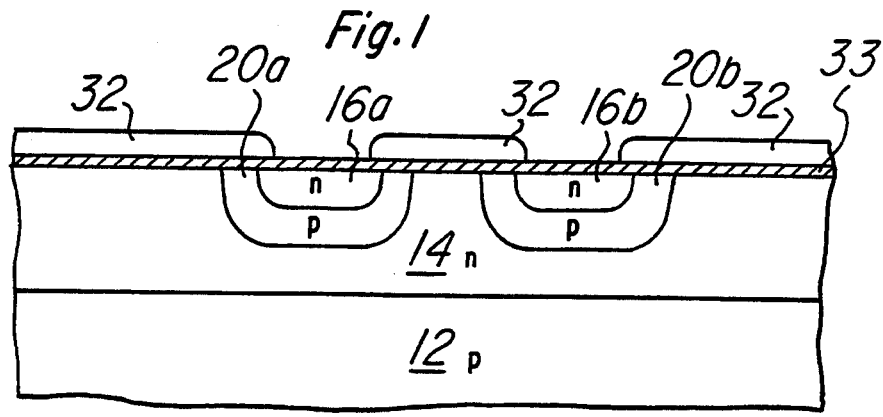
FIGS. 2 through 6 are cross-sectional views illustrating various steps in the fabrication process.

Referring first to FIG. 2, a substrate 12 is provided with a semiconductor layer 14 provided thereon. As previously described, the substrate configuration is not critical to the present invention and may comprise a well region formed in a semiconductor layer, an epitaxially deposited layer or a monocrystalline substrate. In the embodiment illustrated, an n doped layer 14 is formed over a p doped substrate 12. In one example, the substrate 12 comprises a p-type, about 10 to 20 Ω-cm substrate on which 7 μm deep n-type well region 14 is diffused.

In a preferred embodiment, a pad insulating layer 33 is formed over semiconductor layer 14. The pad insulating layer 33 may comprise a 400Å oxide which is either deposited or thermally grown.

A mask layer 32 is formed on the surface of layer 14. The mask layer 32 is patterned using known photolithographic techniques.

D-well structure 20 and n region 16 are formed in the regions of layer 14 which are exposed by the openings in mask layer 32. In the preferred embodiment, the n region 16 is formed by diffusing arsenic and the p region 20 is formed by diffusing boron. In the preferred embodiment, these diffusions are performed simultaneously. As is known in the art, arsenic does not diffuse as quickly as boron. The boron and arsenic impurities may have been implanted through pad oxide 33 and into the layer 14 prior to the diffusion step.

Figure 3:
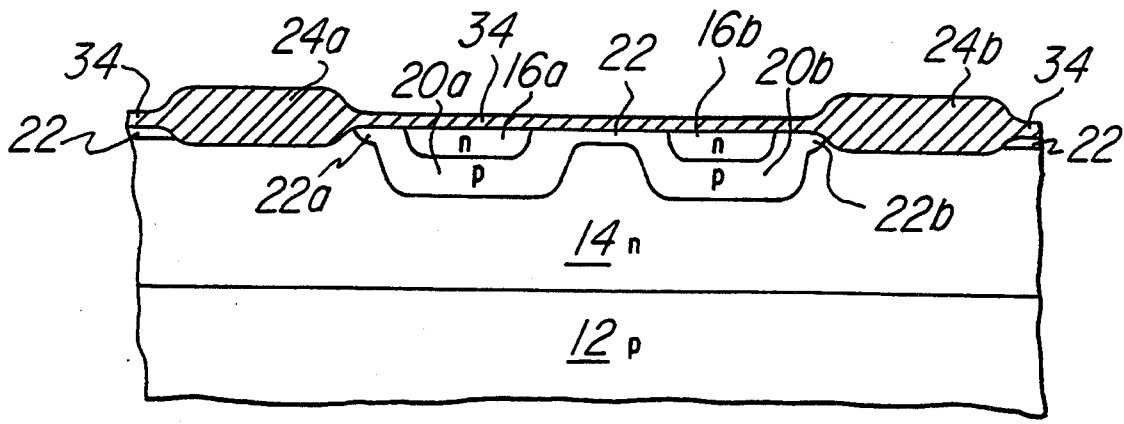

After the n and p structure is formed, the mask material 32 is removed. A second mask (not shown) is then formed and patterned. A field insulating region 24 is formed in regions defined by this second mask (not shown). The field insulating regions 24 are illustrated in FIG. 3. In the preferred embodiment, the field insulating regions 24 are formed by thermally growing an oxide to form a field oxide 24. The thickness of the field insulating region 24 may vary greatly.

After the second mask (not shown) is removed, a dummy insulating layer 34 is formed. The dummy insulating layer 34 may preferably be formed by thermally growing an oxide or alternatively by depositing an oxide or a nitride.

A blanket implant is performed next to form shallow extension regions 22. Boron is the preferred impurity but other dopants such as aluminum or gallium may alternatively be used. It is noted that since no mask is used, the light boron dose will be implanted throughout all the semiconductor regions. This small amount of additional impurities should not effect overall device operation. In the preferred embodiment, the boron is implanted with an energy level of about 30 keV and with a dosage of about $3 \times 10^{11}/cm^2$.

The use of a blanket implant step provides an advantage in some process flows, such as a CMOS process flow, in which other devices are being simultaneously formed and already use this implant. In this type of situation, being able to use a blanket implant provides a significant advantage since no additional masking steps are required. In other words, even if the structure did not provide any performance advantages but provided a parity performance, an advantage is attained by having a simpler process flow.

Figure 4:
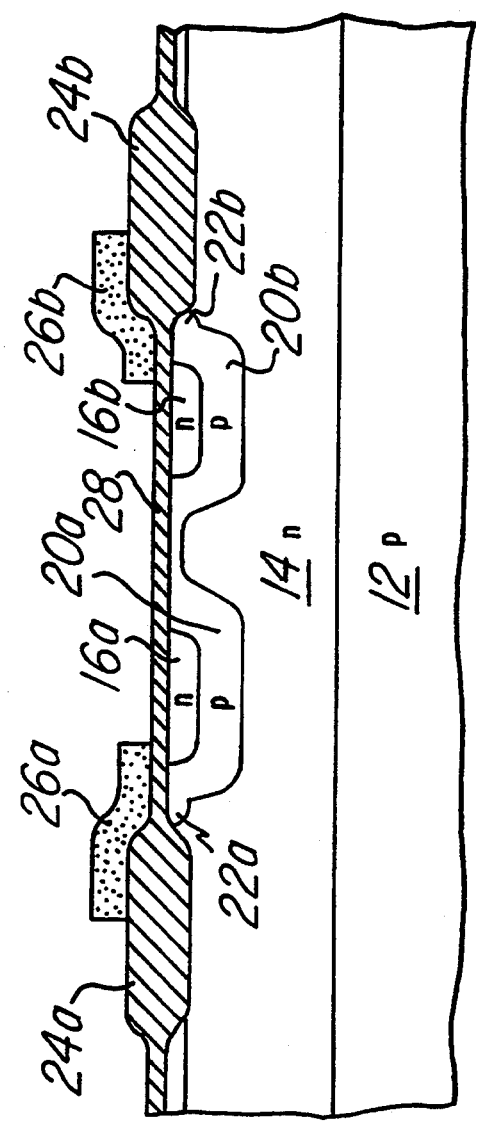

Referring now to FIG. 4, the dummy insulating layer 34 is removed and gate dielectric 28 is formed. In the preferred embodiment, gate dielectric 28 is a thermally grown oxide such as silicon dioxide. The gate dielectric may be between about 100 Å to 1000 Å thick and is preferably about 500Å. In other embodiments, the gate dielectric may be deposited and may comprise oxide, nitride or both, as examples.

A blanket layer of gate electrode 26 material is next formed. In the preferred embodiment, a layer of polysilicon is deposited and may be between about 1500Å and 10,000 Å thick. The gate electrode is preferably n-type doped by diffusing a dopant such as phosphorus. For example, a gaseous $POCl_3$ source may be used. Alternatively, the gate electrode may be implanted or may be in situ doped during the deposition step.

The gate layer is then patterned and etched to form gate electrodes 26. Preferably, the edge of the gate electrode 26 is past the junction of regions 16 and 20. Accordingly, the gate electrode 26 extends over a portion of n region 16, a portion of D-well 20, extension region 22 and over field insulating region 24.

Figure 5:
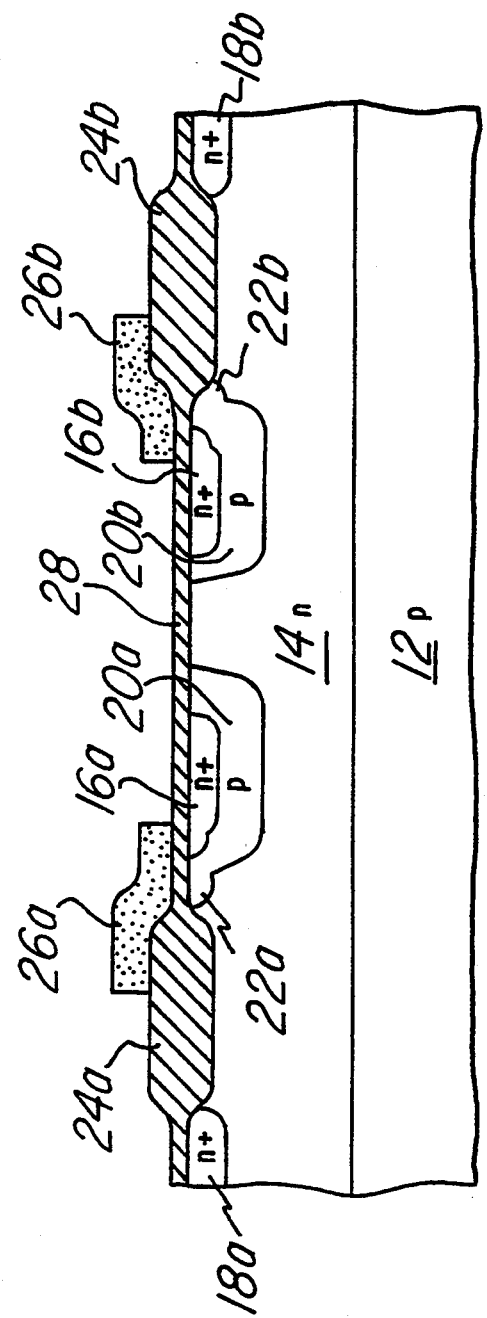

Another mask (not shown) is then patterned to form the more heavily doped portion of source 16 and the drain 18. The resultant structure is illustrated in FIG. 5. As illustrated, the source region 16 comprises a more heavily doped portion as well as a lightly doped source region which underlies gate 26.

Referring now to FIG. 6, more heavily doped body region 30 is formed between D-well 20a and D-well 20b. The body region 30 serves to connect the adjacent D-well regions and forms a good body contact.

The final steps in the fabrication flow have not been illustrated. As is known in the art, contacts, interconnects, insulating layers and protective overcoat are formed to couple this device to other devices in the circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method of forming a lateral DMOS transistor comprising the steps of:
   providing a semiconductor layer of a first conductivity type;
   forming a field insulating region in said semiconductor layer:
   forming a D-well region in said semiconductor layer, said D-well being formed of a second conductivity type opposite said first conductivity type;
   forming a shallow, extension region of said second conductivity type extending from said D-well region to a first side of said field insulating region;
   forming a first source/drain region in said D-well region and spaced from said field insulating region;
   forming a second source/drain region in said semiconductor layer adjacent a second side of said field insulating region opposite said first side; and
   forming a gate electrode overlying the surface of said semiconductor layer and insulated therefrom by a gate dielectric, said gate electrode formed over a portion of said first source/drain region, said D-well region, and a portion of said field insulating region.

2. The method of claim 1 wherein said step of forming a field insulating region comprises thermally growing a field oxide.

3. The method of claim 1 wherein said second conductivity type is p type.

4. The method of claim 1 wherein said shallow extension region is formed by implanting boron.

5. The method of claim 1 wherein said step of forming a gate electrode comprises the steps of depositing a polysilicon layer, doping said polysilicon layer and patterning and etching said polysilicon layer.

6. The method of claim 1 wherein said semiconductor layer comprises a silicon layer.

7. The method of claim 1 wherein said step of providing a semiconductor layer comprises the step of epitaxially growing a silicon layer over a substrate of said second conductivity type.

8. The method of claim 1 and further comprising the step of forming a conductively doped region in said semiconductor layer and adjacent said first source/drain region.

9. The method of claim 5 wherein said gate electrode is in situ doped during said step of depositing.

10. The method of claim 3 said step of forming a D-well comprises the step of diffusing boron.

11. The method of claim 3 wherein said first and second source/drain regions are doped with arsenic or phosphorus.

12. A method for forming a transistor device comprising the steps of:
   providing a silicon layer of a first conductivity type;
   forming a D-well structure by simultaneously diffusing a first and a second impurity wherein said second impurity diffuses at a faster rate than said first impurity and wherein said first impurity is of said first conductivity type and said second impurity is of a second conductivity type;
   forming a field insulation region in the surface of said semiconductor layer and spaced from said D-well;
   performing a shallow blanket implant of said second impurity;
   forming a gate dielectric layer over said semiconductor layer;
   forming a gate conductor layer over said gate dielectric layer;
   patterning and etching said gate conductor layer to form a gate electrode, said gate electrode extending from said D-well to said field insulation region; and
   forming first and second source/drain regions adjacent opposite ends of said field insulating region, wherein a channel region is created between said first source/drain region and said field insulation region.

13. The method of claim 12 wherein said first impurity comprises arsenic and said second impurity comprises boron.

14. The method of claim 12 wherein said step of forming a field insulation region comprises the step of thermally growing a field oxide.

15. The method of claim 12 wherein said step of forming a gate dielectric comprises the step of thermally growing an oxide.

16. The method of claim 12 wherein said step of forming a gate dielectric comprises the step of depositing a gate dielectric.

17. The method of claim 16 wherein said dielectric is chosen from the group consisting of oxides, nitrides or a combination thereof.

18. The method of claim 12 wherein said step of forming a gate conductor comprises the step of depositing a polysilicon layer.

19. The method of claim 18 wherein said polysilicon layer is in situ doped.

20. The method of claim 12 and further comprising the step of doping said gate conductor by ion implantation.

21. The method of claim 12 and further comprising the step of doping said gate conductor by diffusion.

22. The method of claim 21 wherein said diffusion is performed with a gaseous $POCl_3$ source.

* * * * *